(12) United States Patent
Powell et al.

(10) Patent No.: US 6,597,205 B2
(45) Date of Patent: Jul. 22, 2003

(54) HIGH ACCURACY METHOD FOR DETERMINING THE FREQUENCY OF A PULSE INPUT SIGNAL OVER A WIDE FREQUENCY RANGE

(75) Inventors: Robert W. Powell, Furlong, PA (US); Anthony F. DiGiulian, Chalfont, PA (US); Toru Komatsu, Jenkintown, PA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/026,228

(22) Filed: Dec. 21, 2001

(65) Prior Publication Data

US 2003/0117181 A1 Jun. 26, 2003

(51) Int. Cl.$^7$ ................................................ H03K 9/06
(52) U.S. Cl. ...................................................... 327/48
(58) Field of Search ..................... 327/39–49; 377/19, 377/20

(56) References Cited

U.S. PATENT DOCUMENTS

| 4,261,037 A | * | 4/1981 | Hicks ........................ 705/412 |
| 4,319,843 A |   | 3/1982 | Gornall |
| 5,198,750 A |   | 3/1993 | Prokin |
| 5,930,294 A | * | 7/1999 | Chapman ..................... 327/48 |
| 6,058,487 A | * | 5/2000 | Isoda ......................... 713/502 |
| 6,362,693 B2 | * | 3/2002 | Unterricker ................. 327/48 |
| 6,473,607 B1 | * | 10/2002 | Shohara et al. ............. 455/343 |

FOREIGN PATENT DOCUMENTS

| JP | 55-95876 | 7/1980 |
| JP | 59-105563 | 6/1984 |
| JP | 3-222553 | 10/1991 |

OTHER PUBLICATIONS

Matazaba, L., "Measurement of the carrier frequency of rf pulses", journal article in "Measurement Techniques", vol. 32, No. 3, pp. 240–242, Aug. 3, 1989.

Parrilla, M., et al., "Digital signal processing techniques for high accuracy ultrasonic range measurements", journal paper in "IEEE Transactions on Instrumentation and Measurement", vol. 40, No. 4, pp. 759–763, Aug. 1997.

Prokin, M., "Double buffered wide–range frequency measurement method for digital tachometers", journal paper in "IEEE Transactions on Instrumentation and Measurement", vol. 40, No. 3, pp. 606–610, Jun. 1991.

Sekiya, H., et al., "Microwave frequency counter", journal paper in "Anritsu Technical bulletin", No. 74, pp. 10–16, Oct. 1997.

* cited by examiner

Primary Examiner—My-Trang Nu Ton
(74) Attorney, Agent, or Firm—Andrew A. Abeyta; Ortiz & Lopez, PLLC

(57) ABSTRACT

A method and system for determining the frequency of a pulse input signal is disclosed. A pulse count and a timer count can be captured at a start and end of a predetermined measurement interval to thereby obtain a start pulse count and an end pulse count and a start pulse time and an end pulse time thereof. A pulse frequency can then be determined, the pulse frequency comprises the end pulse count minus the start pulse count divided by the end pulse time minus the start pulse time, thereby permitting a highly accurate frequency measurement of the pulse input signal to be obtained over a wide frequency range. The pulse count and the timer count can be captured respectively utilizing a pulse counter and a timer. The pulse frequency generally comprises a frequency of an input pulse signal, such that the pulse frequency is determined based on an accuracy dependent only upon a reference timer clock.

26 Claims, 3 Drawing Sheets

HIGH ACCURACY METHOD FOR DETERMINING THE FREQUENCY OF A PULSE INPUT SIGNAL OVER A WIDE FREQUENCY RANGE

TECHNICAL FIELD

The present invention is generally related to frequency measurement methods and systems. The present is also related to pulse signal measurement methods and systems. The present invention is additionally related to timer clock and crystal controlled oscillator devices. The present invention is additionally related to frequency measurement circuits.

BACKGROUND OF THE INVENTION

The frequency measurement of a periodic pulse signal can be defined as the average number of pulses evaluated over a time period. In a typical micro controller, a crystal-controlled oscillator can generate a timer clock, which is utilized as a reference for the measurement. The accuracy of the timer clock is very accurate. The actual measurement of the pulse signal, however, can introduce unacceptable accuracy. For some measurement techniques that are accurate at high frequencies, the low frequency measurements are inaccurate. Other methods that are inaccurate at low frequencies can be prone to be inaccurate at high frequencies.

FIG. 1 depicts a prior art timing diagram 10 illustrating a pulse count over a fixed period. One technique for calculation involves counting the number of pulses that occurred over a fixed period of time. In such a technique, as illustrated in FIG. 1, a timer and a counter can be initiated simultaneously. The timer is set to expire after a predetermined amount of time. The counter can count the number of pulses that occur while the timer is enabled. When the timer terminates, the counter will stop. The number of counts that occurs at the end of the period is divided by the time period to determine frequency. As indicated in timing diagram 10 of FIG. 1, a pulse input signal 12 indicates the number of pulses that occur a fixed measurement period 16, while a timer clock 14 (i.e., timer) runs over the fixed measurement period 16. In general, the percent accuracy of this measurement technique can be determined by the following formulation of equation (1):

$$\text{Percent Accuracy} = 100\% \times \frac{2}{\text{Number Pulse Counted }(M)} \quad (1)$$

Additionally, frequency can be determined according to the formulation indicated in equation (2):

$$\text{Frequency} = \text{Number of Pulses/Time Period} \quad (2)$$

The approach illustrated in FIG. 1 is limited because the first and last pulses that are counted are not synchronized to the measurement timer clock 14. This can result in an error of up to two pulse times. At high frequencies, this may be insignificant because at a high frequency, the number of pulses counted over a measurement period is very large and an error of two pulses is relatively small. At lower frequencies, the number of pulses counted becomes proportionally smaller. As a result, the accuracy of the measurement decreases as the frequency decreases. At frequencies close to the sample period, accuracy can exceed 100%.

FIG. 2 illustrates a prior art timing diagram 20 illustrating pulse time measurement for a fixed number of pulses. In the approach illustrated by timing diagram 20 of FIG. 2, the time between one or more pulses is measured. Timing diagram 20 depicts a timer clock 26 and a pulse input signal 24. A time period 22 extends over a range of pulses generated by pulse input signal 24. The technique illustrated in FIG. 2 can solve the low frequency inaccuracy inherent with the method discussed above with reference to FIG. 1. In the method illustrated in FIG. 2, however, a timer (i.e., timer clock 26) is initiated by an enable signal that is triggered at the rising edge of an input pulse. A counter can then be used to count a particular number of pulses. After a predetermined number of pulses have been counted, a trigger generated by the rising edge of the next input signal disables the timer. In general, timing diagram indicates that the timing measurement takes place for a fixed number of pulses. Percent accuracy can be calculated according to the formulation of equation (3):

$$\text{Percent Accuracy} = 100\% \times \frac{\text{Input Frequency}}{\text{Timer Frequency}} \quad (3)$$

The measurement method illustrated in FIG. 2 permits the pulse input frequency to be determined by dividing the number of pulses (which is a constant) by the measurement time period. Frequency can be determined according to the following formulation of equation (4):

$$\text{Frequency} = (\text{Sample Clock Rate}) \times \frac{\text{Number of Pulses }(M)}{\text{Measured Time Period }(N)} \quad (4)$$

where

M=Set Number of Pulses (Constant)

N=Number of Clock Pulses that Elapse

The method illustrated in FIG. 2 provides good accuracy at lower frequencies where the pulse count is small compared to the timer clock frequency. In order to make low frequency measurements in a reasonable amount of time, the number of pulses that are counted is relatively small. For example, in order to measure a 10 Hz signal at least once every 200 milliseconds, a pulse count of 2 can be used. This is fine for low frequencies; however, at a higher frequency this small number of pulses can result in inaccuracy caused by the resolution of the timer/counter. For example, at 100 kHz, 2 pulses will occur in 20 microseconds. The resolution of a 1 megahertz timer counter is 1 microsecond. This results in an error of 1 part in 20 or 5%.

Besides the error being dependent on the input frequency, so is the acquisition period. The amount of time is inversely proportional to the input frequency. This makes it inconvenient to apply to measurement processes that require a predictable amount of time to perform input acquisition.

Based on the foregoing, the present inventors have concluded that a need exists for a method and system for determining the frequency of a pulse input signal over a wide frequency range. Such a method and system, if implemented properly, should additionally result in highly accurate measurement results over a wide frequency range. A need also exists for an improved method and system for measuring pulse frequency, unlike previous techniques, which focus on the measurement of power of a signal with regard to a reference signal.

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

It is therefore one aspect of the present invention to provide an improved method and system for measuring frequency.

It is another aspect of the present invention to provide a method and system for reliably measuring the frequency of an input periodic pulse signal over a wide frequency range.

It is still another aspect of the present invention to provide a frequency measurement method and system whose measurement accuracy is dependent only upon a reference timer clock.

It is yet another aspect of the present invention to provide a frequency measurement method and system whose measurement accuracy is constant over an entire specified frequency range.

It is yet another aspect of the present invention to provide a measurement method and system, which provides a measurement acquisition time that is predictable regardless of the frequency of the measured signal.

The above and other aspects can be achieved as is now described. A method and system for determining the frequency of a pulse input signal is disclosed herein. A pulse count and a timer count can be captured at a start and end of a predetermined measurement interval to thereby obtain a start pulse count and an end pulse count and a start pulse time and an end pulse time thereof. A pulse frequency can then be determined, wherein the pulse frequency comprises the end pulse count minus the start pulse count divided by the end pulse time minus the start pulse time, thereby permitting a highly accurate frequency measurement of the pulse input signal to be obtained over a wide frequency range. The pulse count and the timer count can be captured respectively utilizing a pulse counter and a timer. The pulse frequency generally comprises a frequency of an input pulse signal, such that the pulse frequency is determined based on accuracy dependent only upon a reference timer clock. The frequency input signal is generally utilized as a clock for a pulse counter and as a capture latch signal for the system free running timer. In so doing, when a pulse occurs, it will increment the pulse counter and latch the current system time at which it occurred. In this manner, a pulse count and an associated pulse time can be captured for the first and last pulses that occur within a predetermined measurement period. In doing so the frequency of the input pulse signal can be calculated by dividing a difference of the start count and the end count captured in the predetermined measurement interval by a difference of the respective captured start time and end time of the same predetermined measurement interval.

Since the accuracy of a pulse frequency measurement is thus limited only to the accuracy of an associated crystal oscillator frequency and a resolution of a reference timer clock with respect to the predetermined measurement period. The pulse count and timer count can thus be captured utilizing at least two free running counters. Each counter can be configured as an integrated circuit counter that provides a low order counting capability. An overflow signal can be directed from one or more of the integrated circuit counters into an interrupt (i.e., interrupt line) of a micro controller to provide higher order counters thereof.

A frequency measurement circuit can be configured to automatically measure the pulse frequency, wherein the frequency measurement circuit comprises a timer clock linked to a first integrated circuit counter. The first integrated circuit counter provides a signal to a comparator and a timer latch. A micro controller contains a time interrupt line, a write line, a read line, a data line, and a pulse overflow interrupt line, wherein the micro controller is connected to the comparator at the write line, the read line, and the time interrupt line and connected to timer latch at the data line. Additionally, a second integrated circuit counter can provide a first output signal to the read line of the micro controller, wherein the read line is connected at least one output line of the timer latch. A second output signal of the second integrated circuit counter is generally provided to the pulse overflow interrupt line of the micro controller. The micro controller comprises a first storage register for storing a high order time count and a second storage register for storing a high order pulse count. The timer clock can be configured as a crystal oscillator, while the second output signal of the second integrated circuit counter comprises an overflow signal.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate an embodiment of the present invention and are not intended to limit the scope of the invention.

The present invention disclosed herein is directed toward a measurement method and system for reliably measuring the frequency of an input period pulse signal with accuracy dependent only upon a reference timer clock, wherein the accuracy is constant over an entire specified frequency range. A design is thus disclosed, which can eliminate the inaccuracies of prior art calculation techniques, while providing accuracy limited only by the time clock's crystal oscillator over the entire frequency range.

Figure 1:
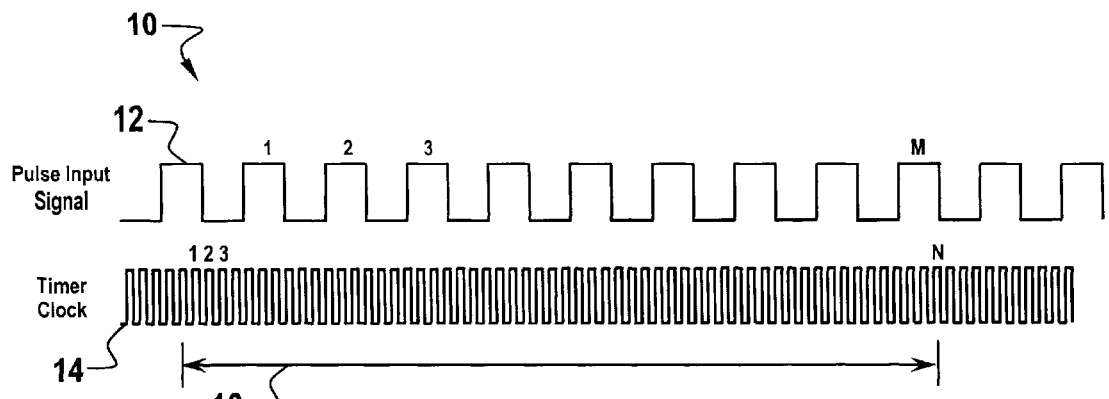
FIG. 1 depicts a prior art timing diagram illustrating a pulse count over a fixed period.
Figure 2:
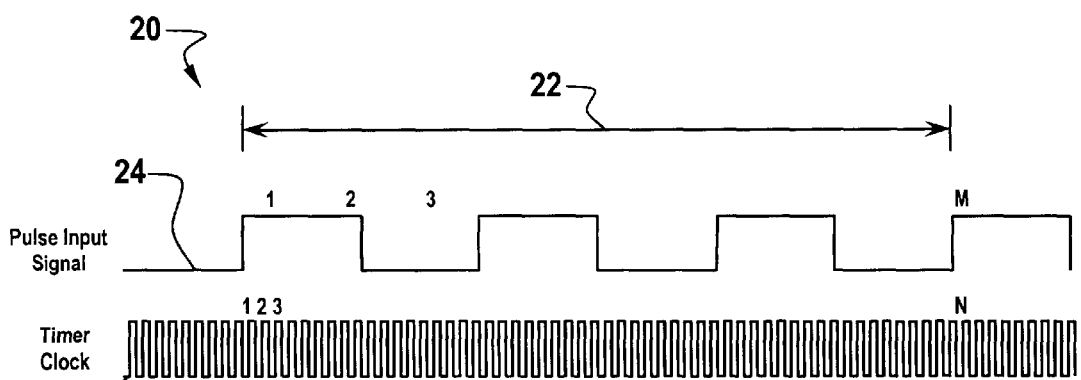
FIG. 2 illustrates a prior art timing diagram illustrating pulse time measurement for a fixed number of pulses.
Figure 3:
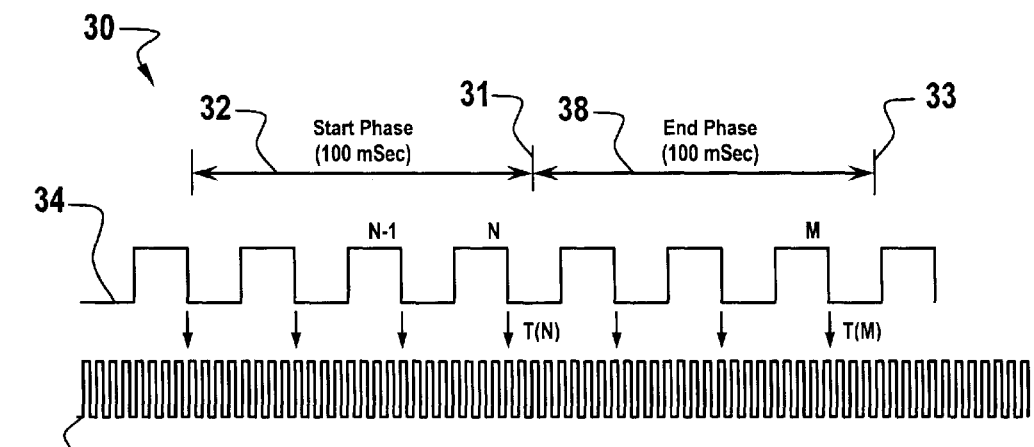
FIG. 3 depicts a timing diagram illustrative of method for determining frequency by the capture of pulse count and time, in accordance with a preferred embodiment of the present invention.

FIG. 3 depicts a timing diagram 30 illustrative of method for determining frequency by the capture of pulse count and time, in accordance with a preferred embodiment of the present invention. Timing diagram 30 depicts a timer clock 36 and a pulse input signal 34. Note that a sample time is captured with each pulse. A start phase 32 is illustrated in FIG. 3 in addition to an end phase 38. The start phase 32 can be, for example, approximately 100 mSec, and the end phase 38 can be approximately 100 mSec. Line 31 separating start phase 32 from end phase 38 represents the last captured count (N) and time T (N) saved in start phase 32. Line 33 represents the last captured count (M) and time T (M) saved in end phase 38.

FIG. 3 illustrates a frequency measurement solution for both high and low frequency signals, while providing accuracy limited only to the timer clock accuracy. The acquisition time, according to the method and system described herein, is consistent. The accuracy is constant for all input frequencies. The basis for this solution is to utilize a pulse counter and a timer capture function to essentially "capture" both the pulse count and the timer count at the start and end of a predetermined measurement interval. This permits a pulse frequency measurement to be performed based on the following calculation:

$$\text{Frequency} = \frac{\text{End Pulse Count} - \text{Start Pulse Count}}{\text{End Pulse Time} - \text{Start Pulse Time}} \quad (5)$$

The accuracy of this technique is limited to the accuracy of the crystal oscillator frequency and the resolution of the timer clock with respect to a predetermined measurement period. For a 1 MHz timer, for example, over a 200 mSec measurement period, the resolution accuracy is approximately 1 microsecond over 200 milliseconds or 0.0005% (for comparison, the crystal oscillator accuracy typically is within 10 ppm or 0.001%). The frequency range, according to this method, is typically in the range of approximately 10 Hz to 100 kHz, but can be extended according to the method and system described herein.

The frequency measurement, according to the method and system disclosed herein, can be performed in two phases: a start phase 32 and an end phase 38. Both the start and end phase acquisition times are predetermined. In the illustrative example of FIG. 3, both the start and end acquisition times are set to 100 milliseconds, thereby making the total frequency input acquisition time 200 milliseconds. In the start phase the input frequency and the timer clock are utilized to drive a pulse counter and a timer counter. During the start phase 32, an associated processor or microprocessor will wait 100 milliseconds and then check to determine if at least one input pulse occurred. If a pulse occurred, the processor will read the value of both the pulse counter and the pulse timer. If no pulses occur during the start phase 32, the signal is determined to be less than 10 Hz and will be considered out of range. At the end of the start phase 32, the pulse and timer counters are read and stored as the start count and start time respectively. The values stored are thus the captured count and timer of the last pulse that occurred during the start phase 32.

The end phase 38 is similar to the start phase 32 as it waits a predetermined timer period (e.g., 100 milliseconds), and captures the count and time of the last pulse that occurs. When the end phase 38 finishes, the values of the pulse counter and timer are saved as the end count and end time. If no pulses occur during either the start or end phase, the input frequency is considered to be below range.

Once the start and end count and time are stored, the frequency of the input pulse signal can be calculated by dividing the difference of the start and end count by the start and end time:

$$\text{Frequency} = \frac{\text{End Count} - \text{Start Count}}{\text{End Time} - \text{Start Time}} \quad (6)$$

Similarly, frequency can be calculated according to the following representation, wherein the variable M, N and T (Time) illustrated in FIG. 3 can be utilized:

$$\text{Frequency} = \frac{M - N}{(T(M) - T(N))} \quad (7)$$

Figure 4:
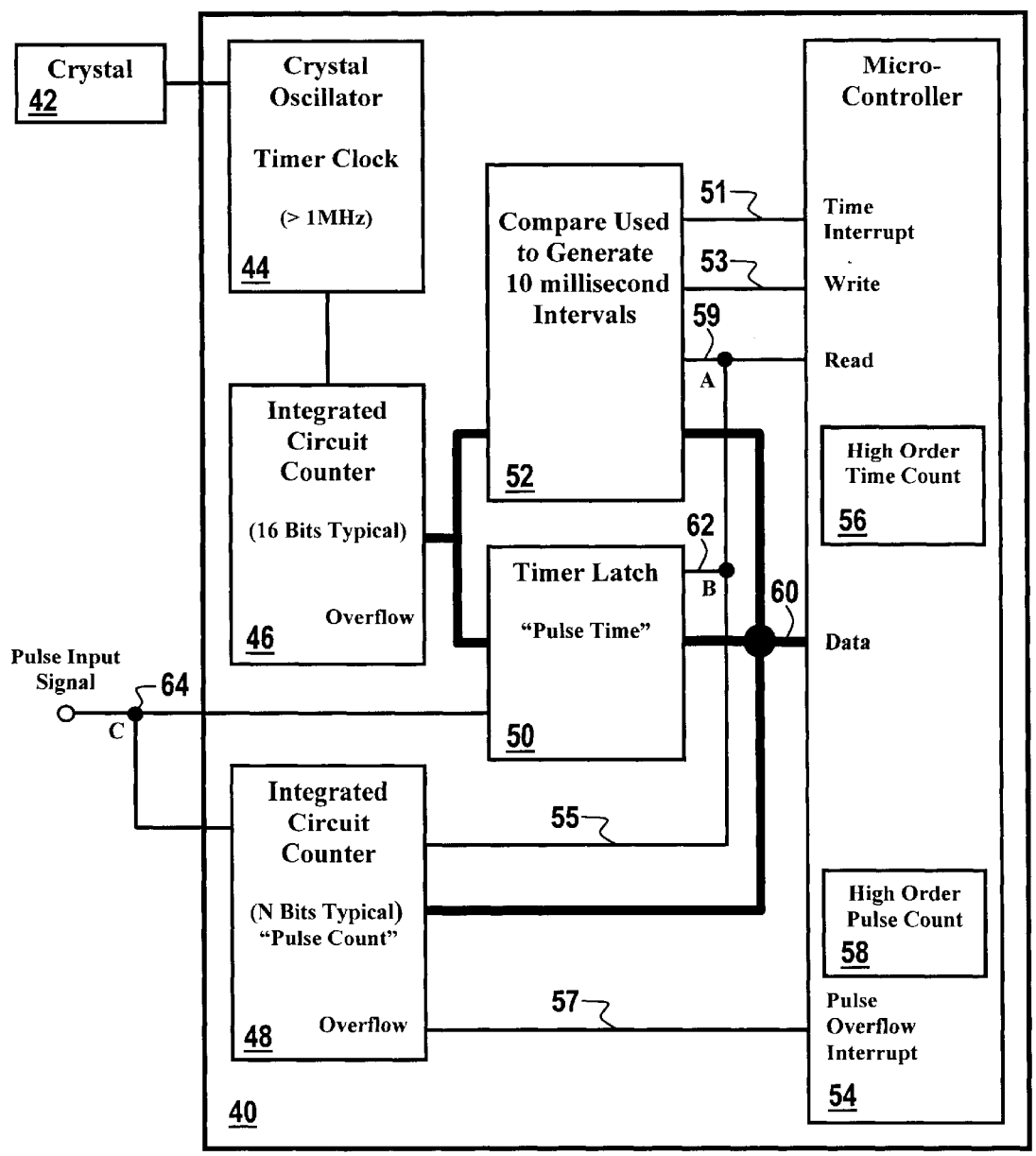
FIG. 4 illustrates a block diagram illustrating a frequency capture circuit, in accordance with a preferred embodiment of the present invention.

FIG. 4 illustrates a block diagram illustrating a frequency capture circuit 40, in accordance with a preferred embodiment of the present invention. Circuit 40 can be implemented based on the utilization of at least two free running counters. A first counter is utilized to count timer clocks. A second counter can be utilized to count input pulses. Such free running counters can be implemented as integrated circuit counters that provide low order counting capabilities. An overflow signal of such an integrated circuit counter can be directed into an interrupt of a micro controller in a manner that permits software thereof to provide higher order counters.

Thus, circuit 40 can be configured to automatically measure pulse frequency. Circuit 40 generally comprises a timer clock 44 linked to a first integrated circuit counter 46. In the illustrative example depicted in FIG. 4, timer clock 44 can be configured as a crystal oscillator linked to crystal 42, wherein timer clock 44 operates in a range greater than 1 MHz. The integrated circuit counter 46 can, for example, be configured as a typical 16-bit integrated circuit counter. The first integrated circuit counter 46 generally provides a signal to a comparator 52 and a timer latch 50. A micro controller 54 contains a time interrupt line 51, a write line 53, a read line 59, a data bus 60, and a pulse overflow interrupt line 57. Micro controller 54 is generally connected to comparator 52 at write line 53, read line 59, and time interrupt line 51. Micro controller 54 is also connected to timer latch 50 and data bus 60.

Additionally, a second integrated circuit counter 48 can provide a first output signal along a line 55 to read line 59 of micro controller 54. Read line 59 is generally connected at least one output line 62 of timer latch 50 at node B. Output line 62 is thus tied to read line 59 at node A and node B. Note that node A and node B are essentially the same node. A second output signal of the second integrated circuit counter 48 can be provided to pulse overflow interrupt line 57 of micro controller 54. The micro controller 54 additionally comprises a first storage register 56 for storing a high order time count and a second storage register 58 for storing a high order pulse count. The second output signal of second integrated circuit counter 48 generally comprises an overflow signal. A pulse input signal is provided to second integrated circuit counter 48 at node C, which is additionally tied to an input line 64 of timer latch 50.

For illustrative purposes only, assume that a 100-millisecond measurement time is utilized. The lower frequency that can be measured is limited by the measurement time. For 100 milliseconds, the lowest frequency measurable is 1/100 milliseconds >10 Hz. Extending the measurement time will extend the low frequency range.

The measurement process begins by reading the current time (counter value) and adding the equivalent of 10 milliseconds in counts and writing this value to a compare register (i.e., comparator 52). A compare interrupt (i.e., via time interrupt line 52) is then enabled, such that the 16-bit compare interrupt of comparator 52 will generate an interrupt after 10 milliseconds. When the interrupt occurs, an additional 10 milliseconds worth of counts is added to the previous compare value to generate an interrupt 10 milliseconds later. This provides a periodic 10-millisecond interrupt that can be utilized as the time base. (Note that the values provided herein are presented for illustrative purposes only and are not considered limiting features of the present invention.)

The 10-millisecond sample period can be utilized for two reasons. First, although the acquisition time is generally 200 milliseconds according to the illustrative example discussed above, a clock frequency of 1 megahertz requires 200,000 counts, which is greater than the 65,536 maximum value of a 16 bit number. The compare register (i.e., comparator 52) and the timer counter (i.e., timer clock 44 and first integrated circuit counter 46) are only 16 bits. The second reason that a 10-millisecond sample is utilized is due to the timer counter rolling over. Although the timer latch 50 (i.e., "Pulse Time") will capture the lower 16 bits of the timer counter when the pulse occurs, a high order count can be captured in associated software. In order to accomplish this, the pulse detection must be sampled faster than twice the rollover rate so that the algorithm will be able to determine if the pulse occurs before or after a timer roll over. A 10 millisecond period can be chosen, but time periods less than 32,768 milliseconds for a 1 megahertz clock can also be implemented, in accordance with the method and system described herein. Generally, according to the illustrative examples described herein, twenty 10-millisecond periods for reach 200 millisecond acquisition period may be realized.

The pulse counter ("Pulse Count"), which is indicated in FIG. 4 as second integrated circuit counter 48 can be implemented as an eight bit pulse counter a 16 bit high order pulse counter utilizing a processor data register. The overflow of the pulse counter (i.e., see line 57) is connected to interrupt on the processor (i.e., micro controller 54). When micro controller 54 detects an interrupt on the pulse counter overflow (i.e., line 57), the 16 pulse allows the software to provide higher order pulse counts simply by incrementing the high order pulse count via storage register 58 of micro controller 54. Both the hardware pulse counter (i.e., second integrated circuit counter 48) and the high order pulse count (storage register 58) are free running counters in that they roll over and restart at 0 upon attaining their maximum count.

The input pulse signal provided at node C is also directed into timer latch 50, which "captures" the time that the pulse occurred. Timer latch 50 can thus be said to be a "capturing" mechanism. The rising edge can be utilized to capture the pulse time and to increment the pulse count. A falling edge of the input pulse can also be utilized, as long as both the pulse counter (i.e., second integrated circuit counter 48) and timer latch 50 utilize the same edge. When a pulse is "captured" by the pulse latch, a flag is set to indicate that a pulse occurred. This flag does not cause an interrupt, but simply comprises an indicator that at least one pulse occurred during the sample period. Generally, the timer counter can be configured as a free running 16 bit counter that increments on each processor clock cycle. Such a counter will roll over at its maximum count and begin count up again from 0.

An important feature of the present invention requires that both the pulse count and the pulse time be read within the same input pulse, such that the pulse time comprises the time when the pulse count was last updated. The pulse counter is initially read, followed by a reading of the timer capture, and then a re-reading of the pulse counter. If the second counter is same as the first counter read, then the capture is valid. If the count has changed since the last reading, then a pulse must have occurred while reading the pulse time. In this case, software can be utilized to read the time and count again. If the pulse count a second time has again changed, it is determined that the input frequency is too high to capture and an over-range error is generated. If the second read is consistent, the counter is incremented during the first read, but second read is sufficient.

Figure 5:
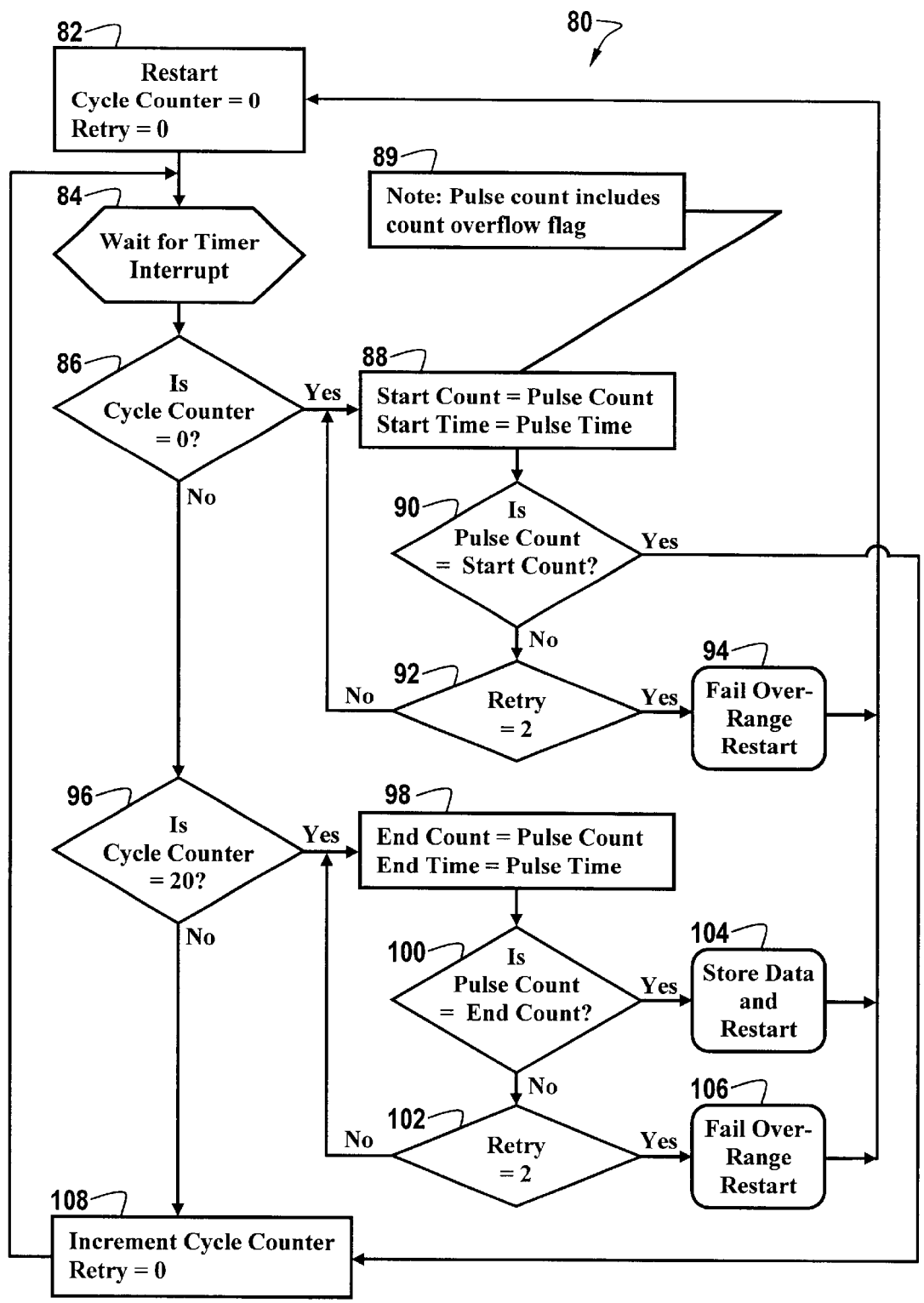
FIG. 5 depicts a flow chart of operations illustrating operational steps for capturing pulse and time for start and end cycles, in accordance with a preferred embodiment of the present invention.

FIG. 5 depicts a flow chart 80 of operations illustrating logical operational steps for capturing pulse and time for start and end cycles, in accordance with a preferred embodiment of the present invention. As indicated at block 82, a restart operation may be initiated in which a cycle counter is set to 0 and a retry value is also set to 0. As indicated thereafter at block 84, a wait occurs for a timer interrupt. Thereafter, as illustrated at block 86, a decision operation can be processed to determine if the current cycle counter is 0. If so, then the operation illustrated at block 88 can be processed, in which the start count is set to be equivalent to the pulse count and the start time is set to be equivalent to the pulse time.

Following processing of the operation described at block 88, a decision operation can be performed, as indicated at block 90, to determine if the pulse count is equivalent to the start count. If the answer is yes, then the operation illustrated at block 108 can be performed, in which an increment cycle counter operation can be processed and the retry value is set to 0. Following processing of the operation depicted at block 108, the operation illustrated at block 84 can then be processed and the cycle can repeat itself. If the answer to the decision operation illustrated at block 90 is no, however, then the decision operation illustrated thereafter at block 92 can be processed, in which a decision is made to determine if the retry value is equivalent to 2. If it is determined that the retry value is not equivalent to 2, then the operation illustrated at block 88 can be processed again. Note that as indicated at block 89, the pulse count includes a count overflow flag. If, however, is determined that the retry value is equivalent to 2, then the operation illustrated at block 94 can be processed in which the fail over-range is restarted.

If it is determined, as illustrated at block 86, that the cycle counter is not equivalent to 0, then the operation illustrated at block 96 can be processed in which a determination is generally made regarding whether or not the cycle counter is equivalent to a value of 20. If the answer is no, then the operation illustrated at block 108 can be processed. If, however, the answer is yes, then the operation depicted at block 98 can be processed in which the end count is equivalent to the pulse count and the end time is equivalent to the pulse time. Following processing of the operation described at block 98, a decision operation can be processed as illustrated at block 100 in which a determination is made as to whether or not the pulse count is equivalent to the end count. The pulse count is the value read from the pulse counter, which is clocked by the measured input pulse signal.

If it is determined that the pulse count is equivalent to the end count, then a store data and restart operation is processed, as described at block 104. If, however, it is determined that the pulse count is not equivalent to the start count, then the operation illustrated at block 102 can be processed. The operation depicted at block 102 determines whether or not the retry value is equivalent to 2. If the retry value, as illustrated at block 102, is equivalent to 2, then a fail over-range results and a restart operation is initiated, as illustrated at block 106. If the retry value is not equivalent to 2, then the operation depicted at block 98 is processed again and the ensuing operational steps are generally repeated.

A 16-bit timer may not be adequate for spanning the entire 100-millisecond acquisition period. The maximum count for a 16-bit counter is 65536. Therefore, an extended counter may be implemented in a processor RAM, so as to allow the timer to be extended to additional bits.

It is important to capture both the 16-bit timer capture and high order software pulse counter for the pulse time. Because only the hardware 16-bit timer is latched on the rising edge of a pulse, the software must determine what the value of the software high order counter was when the pulse capture occurred.

In the illustrative example described herein, the pulse and timer counters can be sampled every 10-milliseconds, even though the start and end capture periods are 100 milliseconds. This "over-sampling" assures that the pulse time of two separate pulses that occurred on two successive 10 millisecond samples will be different and that any captured pulse can be determined if it occurred before or after a timer counter roll over. This can be see in that there are 10,000 one MHz clock periods per 10-millisecond cycle. The 16-bit timer counter wraps around every 65,536 counts. If the 10-millisecond time is generated by adding 10,000 counts to the timer compare register, each successive interval will use a different range of timer values.

The following example indicates such parameters:
1. Sample Period N−1=16 bit timer counter counts D8F0 Hex to 0000 Hex
2. Sample Period N=16 bit timer counter counts 0001 Hex to 2710 Hex
3. Sample Period N+1=16 bit timer counter counts 2711 Hex to 42e0 Hex
4. Any pulse that is captured in sample period N will have a capture time between 1 and 10,000
5. Any pulse that is captured in sample period N+1 will have a capture time between 10,001 and 20,000

When the 10-millisecond sample interrupt reloads the timer compare, the software algorithm checks to determine if a timer rollover occurred and, if such a rollover did in fact occur, adds one to the high order count of the captured time. In the illustrative example described herein, it can be shown that a timer counter roll over would have occurred during a 10-millisecond sample period if the value of the compare register, which triggered the 10-millisecond interrupt, were less than 10,000. The illustrative example described herein also indicates that a pulse that was captured during a rollover sample interval generally possesses a high order bit set to 1 if the pulse occurred before the timer counter rolled over.

In the foregoing description, it is generally required that the processor (e.g., micro controller 54 of FIG. 4) be able to detect if a pulse occurred during a sample period. This can be accomplished by reading and comparing the current value of the pulse count to the value of the pulse count stored on the previous sample period.

A pulse count and time capture on a 10-millisecond scenario, including rollover processing, can be demonstrated according to the following general algorithm:

Capture count=8-bit pulse count+256* software extended count

If capture count=previous capture count

{

Capture time=16-bit pulse time+65536* software extended timer

If current 16-bit timer compare<10,000 then /*timer 16-bit counter roll over occurred*/

{

Increment software extended timer

}

If captured pulse 16-bit timer<10,000 then /*capture occurred after roll over*/

{

Add 65536

}

}

Previous capture count=capture count/*save capture count as previous capture count*/

At the end of 1 00-milliseconds (i.e., ten 10-millisecond timer compare periods), the last pulse time and count time that was captured during the 10-millisecond sample periods can be saved as the start time and count respectively. Ten more samples can then be taken with the last sample time and count being saved as the end time and count respectively. In the entire 200-millisecond acquisition time, 200, 000 sample clocks will have occurred, along with twenty 10-millisecond sample periods, and three or four 16-bit timer counter rollovers.

Subtracting the start count from the end count thus yields the number of pulses that were sampled. The minimum pulse count is 0, indicating that no input pulses occurred. The maximum number of pulses thus can be at the maximum input frequency that can be detected by the capture method described previously. Typically, with a processor that possesses a 1 megahertz system clock, the maximum capture frequency is generally around 400 kilohertz. The typical maximum number of counts is then around 80,000.

Subtracting the start time from the end time yields the time between the start and end pulses. This will be a value between 0 and 20,000, which is a computed fraction of the sample clock frequency. Thus:

$$\text{Input Signal Frequency} = (\text{Processor Frequency}) \times \frac{(\text{End Count} - \text{Start Count})}{(\text{End Time} - \text{Start Time})} \quad (8)$$

Because the end and start pulse count values are captured with their respective capture time values, the only error that may be introduced can be the accuracy of the processor clock. The start count and end count are an integer number of pulses within the resolution of a processor clock cycle. The means that the resolution accuracy is within 2 counts in 200,000 counts or the following:

Theoretical error from counts=0 (counts are an integer value captured on leading edge)

Timer counter resolution for start time=1 timer clock/acquisition time=1 uSec/100 msec=0.001%

Timer counter resolution for end time=1 timer clock/acquisition time=1 uSec/100 msec=0.001%

Total theoretical error=0+2 *0.001%=0.002% over entire frequency range

Other errors may be introduced by the accuracy of the timer counter oscillator and any noise on the rising edge of the pulse input signal that causes the input signal to be distorted.

Based on the foregoing, it can be appreciated that the present invention disclosed herein thus generally describes a method and system for determining the frequency of a pulse input signal over a wide frequency range, wherein frequency measurements obtained thereof are highly accurate and reliable. A single method and/or system for reliably measuring the frequency of an input periodic pulse signal is disclosed herein. The accuracy of such a method and system is dependent only upon the reference timer clock. The accuracy is also constant over an entire specified frequency range. A pulse counter and time capture function can thus be implemented, in accordance with preferred or alternative embodiments of the present invention, to "capture" both the pulse count and timer count at the start and end of a predetermined measurement interval. These values permit pulse frequency measurements to be performed, as described herein.

Additionally, the present invention utilizes a free running high speed clock counter which allows for applications in periodic fixed duration data acquisition periods. The present invention thus describes a continuous method for calculating the frequency by taking a first captured pulse count and pulse time of two consecutive measurement periods. The present invention also describes a method for detecting and compensating for counter overflows.

One of the advantages of the present invention is that it does not require synchronization. In addition, the present invention described herein is generally free running (i.e., no start and stop), and can be easily implemented in a fixed time data acquisition period. In particular, the reference clock and pulse counters described herein are free running and do not require start and stop signals and can be implemented for a fixed data acquisition period.

Unlike prior art methods, the present invention does not measure the frequency of a pulse input or the measurement of the power of a signal with regard to a reference signal. The present invention instead addresses the measurement of pulse frequency. Another advantage of the present invention is that it does not require the use of synchronizer for starting the pulse measurement period and also does not require the use of a clock, which is based on a fixed multiple of measured frequency.

The present invention also does not require the use of an end count interrupt device. Instead, the present invention utilizes the last captured pulse count and timer count values. Another advantage of the present invention is that it does not require a load signal to preload data into the counter and does not require the use of a predetermined pulse count for the measurement of the measurement period. In addition, the approach set forth herein can take advantage of commercially available microprocessors and does not require special logic decoding circuits. The use of a free running timer and pulse counter with a fixed data acquisition period is thus a central advantage of the present invention.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. For example, the method and system described herein can be extended to higher frequencies by implementing the pulse count and pulse time capture in hardware registers that provide higher resolution. Additionally, the method and system described herein can be extended to lower frequencies by either increasing the acquisition time or by comparing the capture time and count between multiple acquisition periods.

Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

The embodimemnts of the invention in which an exclusive property or right is claimed are defined as follows. Having thus described the invention what is claimed is:

1. A method for determining the frequency of a pulse input signal, said method comprising the steps of:
    capturing a pulse count and a timer count at a start and end of a predetermined measurement interval to thereby obtain a start pulse count and an end pulse count and a start pulse time and an end pulse time thereof; and
    determining a pulse frequency, wherein said pulse frequency comprises said end pulse count minus said start pulse count divided by said end pulse time minus said start pulse time, thereby permitting a highly accurate frequency measurement of said pulse input signal to be obtained over a wide frequency range.

2. The method of claim 1 wherein the step of capturing a pulse count and a timer count further comprises the steps of:
    capturing said pulse count utilizing a pulse counter; and
    capturing said timer count utilizing a timer.

3. The method of claim 1 wherein the step of determining a pulse frequency, further comprises the step of:
    determining said pulse frequency, wherein said pulse frequency comprises a frequency of an input pulse signal, such that said pulse frequency is determined based on an accuracy dependent only upon a reference timer clock.

4. The method of claim 3 further comprising the step of:
    calculating said frequency of said input pulse signal by dividing a difference of a start count and an end count of said predetermined measurement interval by a difference of a start time and an end time of said predetermined measurement interval.

5. The method of claim 1 further comprising the step of:
    determining an accuracy of a pulse frequency measurement wherein said accuracy is limited to an accuracy of an associated crystal oscillator frequency and a resolution of a reference timer clock with respect to said predetermined measurement period.

6. The method of claim 1 wherein the step of capturing a pulse count and a timer count further comprises the step of:
    capturing said pulse count and said timer count utilizing at least two free running counters.

7. The method of claim 6 further comprising the step of:
    configuring each of said at least two running counters as an integrated circuit counter that provides a low order counting capability.

8. The method of claim 7 further comprising the step of:
    directing an overflow signal of said integrated circuit counter into an interrupt of a micro controller to provide higher order counters thereof.

9. The method of claim 1 further comprising the step of:
    configuring a frequency measurement circuit to automatically measure said pulse frequency, wherein said frequency measurement circuit comprises:

a timer clock linked to a first integrated circuit counter, wherein said first integrated circuit counter provides a signal to a comparator and a timer latch;

a micro controller having a time interrupt line, a write line, a read line, a data line, and a pulse overflow interrupt line, wherein said micro controller is connected to said comparator at said write line, said read line, and said time interrupt line and connected to timer latch at said data line;

a second integrated circuit counter, which provides a first output signal to said read line of said micro controller, wherein said read line is connected at least one output line of said timer latch; and a second output signal of said second integrated circuit counter provided to said pulse overflow interrupt line of said micro controller.

10. The method of claim 9 wherein said micro controller comprises a first storage register for storing a high order time count and a second storage register for storing a high order pulse count.

11. The method of claim 9 wherein said timer clock comprises a crystal oscillator.

12. The method of claim 9 wherein said second output signal of said second integrated circuit counter comprises an overflow signal.

13. The method of claim 1 further comprising the step of:

reading said pulse count and said pulse time within a same input pulse, such that said pulse time comprises a time when said pulse count was previously updated, thereby determining whether a valid pulse capture occurred.

14. A system for determining the frequency of a pulse input signal, said system comprising:

capturing mechanism for capturing a pulse count and a timer count at a start and end of a predetermined measurement interval to thereby obtain a start pulse count and an end pulse count and a start pulse time and an end pulse time thereof; and measuring mechanism for determining a pulse frequency, wherein said pulse frequency comprises said end pulse count minus said start pulse count divided by said end pulse time minus said start pulse time, thereby permitting a highly accurate frequency measurement of said pulse input signal to be obtained over a wide frequency range.

15. The system of claim 14 wherein said capturing mechanism further comprises a pulse counter for capturing said pulse count; and a timer for capturing said timer count.

16. The system of claim 14 wherein said pulse frequency comprises a frequency of an input pulse signal, such that said pulse frequency is determined based on an accuracy dependent only upon a reference timer clock.

17. The system of claim 16 wherein said frequency comprises a frequency calculated by dividing a difference of a start count and an end count of said predetermined measurement interval by a difference of a start time and an end time of said predetermined measurement interval.

18. The system of claim 14 wherein an accuracy of a pulse frequency measurement determined by said measuring mechanism is based on an accuracy of an associated crystal oscillator frequency and a resolution of a reference timer clock with respect to said predetermined measurement period.

19. The system of claim 14 wherein said capturing mechanism comprises at least two free running counters.

20. The system of claim 19 wherein each of said at least two running counters comprises an integrated circuit counter that provides a low order counting capability.

21. The system of claim 20 further comprising:

directing mechanism for directing an overflow signal of said integrated circuit counter into an interrupt of a micro controller to provide higher order counters thereof.

22. The system of claim 21 wherein said micro controller comprises a first storage register for storing a high order time count and a second storage register for storing a high order pulse count.

23. The system of claim 14 further comprising a frequency measurement circuit to automatically measure said pulse frequency, wherein said frequency measurement circuit comprises:

a timer clock linked to a first integrated circuit counter, wherein said first integrated circuit counter provides a signal to a comparator and a timer latch;

a micro controller having a time interrupt line, a write line, a read line, a data line, and a pulse overflow interrupt line, wherein said micro controller is connected to said comparator at said write line, said read line, and said time interrupt line and connected to timer latch at said data line;

a second integrated circuit counter, which provides a first output signal to said read line of said micro controller, wherein said read line is connected at least one output line of said timer latch;

a second output signal of said second integrated circuit counter provided to said pulse overflow interrupt line of said micro controller.

24. The system of claim 23 wherein said timer clock comprises a crystal oscillator.

25. The system of claim 23 wherein said second output signal of said second integrated circuit counter comprises an overflow signal.

26. The system of claim 23 further comprising:

a reading mechanism for reading said pulse count and said pulse time within a same input pulse, such that said pulse time comprises a time when said pulse count was previously updated, thereby determining whether a valid pulse capture occurred.

* * * * *